(12) United States Patent
Maruyama (10) Patent No.: US 8,075,150 B2
(45) Date of Patent: Dec. 13, 2011

(54) BACKLIGHT UNIT AND DISPLAY DEVICE

(75) Inventor: Naoki Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 297 days.

(21) Appl. No.: 11/970,021

(22) Filed: Jan. 7, 2008

(65) Prior Publication Data

US 2008/0170400 A1 Jul. 17, 2008

(30) Foreign Application Priority Data

Jan. 11, 2007 (JP) .................................. 2007-003855

(51) Int. Cl.
 *F21V 8/00* (2006.01)
(52) U.S. Cl. ....... 362/97.1; 362/97.2; 362/561; 362/580
(58) Field of Classification Search .................. 349/161, 349/61, 62, 65, 67–71; 362/97.1, 560, 561, 362/580, 511, 97.2, 373, 345, 218, 581, 632–634, 362/560 K
 See application file for complete search history.

(56) References Cited

U.S. PATENT DOCUMENTS

| 7,287,879 B2 * | 10/2007 | Hsu | 362/294 |
| 7,625,104 B2 * | 12/2009 | Zhang et al. | 362/294 |
| 2006/0187660 A1 * | 8/2006 | Liu | 362/294 |

FOREIGN PATENT DOCUMENTS

| JP | 2005-317480 | | 11/2005 |
| JP | 2005-352427 A | * | 12/2005 |

OTHER PUBLICATIONS

Machine translation of JP 2005-352427 A, which is assigned to Sony Corp.*

* cited by examiner

*Primary Examiner* — Sharon Payne
(74) *Attorney, Agent, or Firm* — SNR Denton US LLP (57) ABSTRACT

A backlight unit illuminating the rear of a transmissive display panel with light includes a light source substrate, a base member, and a heat pipe. The light source substrate has a light source and faces the rear of the display panel. The base member is made of sheet metal, on which the light source substrate is mounted, and fixed to the rear of a chassis of the backlight unit. The heat pipe is attached to the base member and receives heat generated in the light source through the base member. The base member includes a plurality of groove portions extending in a lengthwise direction of the light source substrate formed at predetermined intervals and a plurality of planes on which the light source substrates facing the display panel are formed respectively. The heat pipe is provided in the lengthwise direction of the light source substrate under each of the planes.

13 Claims, 6 Drawing Sheets

BACKLIGHT UNIT AND DISPLAY DEVICE

CROSS REFERENCES TO RELATED APPLICATIONS

The present invention contains subject matter related to Japanese Patent Application JP 2007-003855 filed in the Japanese Patent Office on Jan. 11, 2007, the entire contents of which being incorporated herein by reference.

BACKGROUND OF THE INVENTION

1. Field of the Invention

The present invention relates to a backlight unit and a display device, and more particularly to the backlight unit and the display device suitable for application to a liquid crystal display device or the like having a large display screen.

2. Description of the Related Art

Liquid crystal display devices have a large display screen and reduced weight, thickness and power consumption as compared to a CRT (Cathode-Ray Tube), and accordingly have been used widely for a television receiver and various displays in addition to a light-emitting display such as a PDP (Plasma Display Panel), for example.

A liquid crystal display device includes a liquid crystal sealed between two transparent substrates having various sizes, and a voltage is applied to change a direction of liquid crystal molecules so that optical transmittance is changed to optically display a predetermined image and the like. Since the liquid crystal is not a light-emitting material, the liquid crystal display device includes a backlight unit serving as a light source at the rear of a liquid crystal panel, for example. The backlight unit is configured to have a primary light source, a light guide plate, a reflection film, a lens sheet or diffusion film, and the like so that display light is supplied over the whole plane of the liquid crystal panel. In the past, a fluorescent tube is sealed with mercury or xenon to obtain a CCFL (Cold Cathode Fluorescent Lamp) as a primary light source for the backlight unit. However, CCFL may have such disadvantages as low light-emission luminance, short life, or insufficient luminance uniformity due to existence of a low luminance area on the cathode side.

An LED backlight unit configured to obtain white light by arraying two-dimensionally a large number of light emitting diodes (hereinafter, referred to as LED (Light Emitting Diode)) of three primary colors of light, which are red, green and blue, on the rear side of the diffusion panel has been attracting attention instead of the CCFL. Such LED backlight unit has low power consumption and is capable of high luminance display on a large-size liquid crystal panel.

Since there is a negative correlation between the temperature of LED and the luminous efficiency thereof, cooling and heat uniformity of the LED may be required. Typically, the temperature rises higher in a central part of the backlight unit than in a periphery portion thereof. Since the luminous efficiency of the LED is generally low and a large amount of heat is generated, an efficient heat discharge system may be required. As a characteristic of LED, light is emitted in one direction, which is different from CCFL, and therefore the heat can be dissipated in the direction opposite to the direction in which light is emitted.

Accordingly, the heat has been dissipated in the past using a bulk material having a certain volume with large heat capacity for the cooling and heat uniformity (for example, refer to Japanese Unexamined Patent Application Publication No. 2005-317480). In the patent document, aluminum (Al) having sufficient heat conduction is used for the bulk material (heat dissipation plate 24) to transmit the heat in the central part of the backlight unit to a heat sink, and further a heat pipe 25 made of copper is used. The heat pipe 25 also contributes to the heat uniformity.

SUMMARY OF THE INVENTION

In the case of using a bulk material such as the heat dissipation plate 24 described in the above patent document, if the size of liquid crystal panel in the liquid crystal display device increases, it may also be necessary to use a large heat dissipation plate 24. As a result, the backlight unit may become heavy and costs for the manufacture may increase.

It is desirable to provide a device including a light source such as the above-described backlight unit, weight and costs of which can be reduced without affecting the heat uniformity of the whole device.

According to an embodiment of the present invention, there is provided a backlight unit illuminating the rear of a transmissive display panel with light. The backlight unit includes: a light source substrate having a light source and facing the rear of the display panel; a base member made of sheet metal on which the light source substrate is mounted and which is fixed to the rear of a chassis of the backlight unit; and a heat pipe attached to the base member and receiving heat generated in the light source through the base member. The base member includes a plurality of groove portions extending in the lengthwise direction of the light source substrate formed at predetermined intervals and a plurality of planes between the groove portions on which the light source substrate facing the display panel are formed respectively. Further, the heat pipe is provided in the lengthwise direction of the light source substrate under each of the planes.

According to the configuration, the base member, on which the light source substrate having the light source is mounted, is formed by processing the sheet metal and includes the plurality of groove portions extending in the lengthwise direction of the light source substrate formed at the predetermined intervals and the plurality of planes between the groove portions on which the light source substrates facing the display panel are formed respectively. Accordingly, the weight of the device is reduced. Further, the heat pipe is provided in the lengthwise direction of the light source substrate on the rear side of the respective planes of the base member using a level difference of the groove portion. Therefore, generated heat due to the light emission in the light source of the light source substrate is transmitted to the heat pipe through the base member. Particularly, the heat is transmitted from a high-temperature central part of the heat pipe to the periphery portion. As a result, the heat of the whole backlight unit may be uniform.

According to another embodiment of the present invention, there is provided a display device. The display device includes: a light source substrate having a light source; a base member made of sheet metal on which the light source substrate is mounted and which is fixed to the rear of a chassis of the display device; and a heat pipe attached to the base member and receiving heat generated in the light source through the base member. The base member includes a plurality of groove portions extending in the lengthwise direction of the light source substrate formed at predetermined intervals and a plurality of planes between the groove portions on which the light source substrates facing a display surface are formed respectively. Further, the heat pipe is provided in the lengthwise direction of the light source substrate under each of the planes.

According to the configuration, the base member, on which the light source substrate having the light source is mounted, is formed by processing the sheet metal and includes the plurality of groove portions extending in the lengthwise direction of the light source substrate formed at the predetermined intervals and the plurality of planes between the groove portions on which the light source substrates facing the display panel are formed respectively. Accordingly, the weight of the device is reduced. Further, the heat pipe is provided in the lengthwise direction of the light source substrate on the rear side of the respective planes of the base member using a level difference of the groove portion. Therefore, generated heat due to the light emission in the light source of the light source substrate is transmitted to the heat pipe through the base member. Particularly, the heat is transmitted from a high-temperature central part of the heat pipe to the periphery portion. As a result, the heat of the whole display device may be uniform.

According to the embodiments of the present invention, weight of the backlight unit and display device having the light source is reduced, while keeping the heat thereof uniform, and therefore material costs can be reduced. Moreover, since the base member is made of plate-shaped material and therefore can be processed readily, the costs for assembly and manufacturing can be reduced.

DESCRIPTION OF THE PREFERRED EMBODIMENTS

Embodiments of the present invention are hereinafter described with reference to the accompanied drawings. In the following embodiments, a display device according to an embodiment of the present invention is applied to a transmissive liquid crystal display device having a backlight unit.

Figure 1:
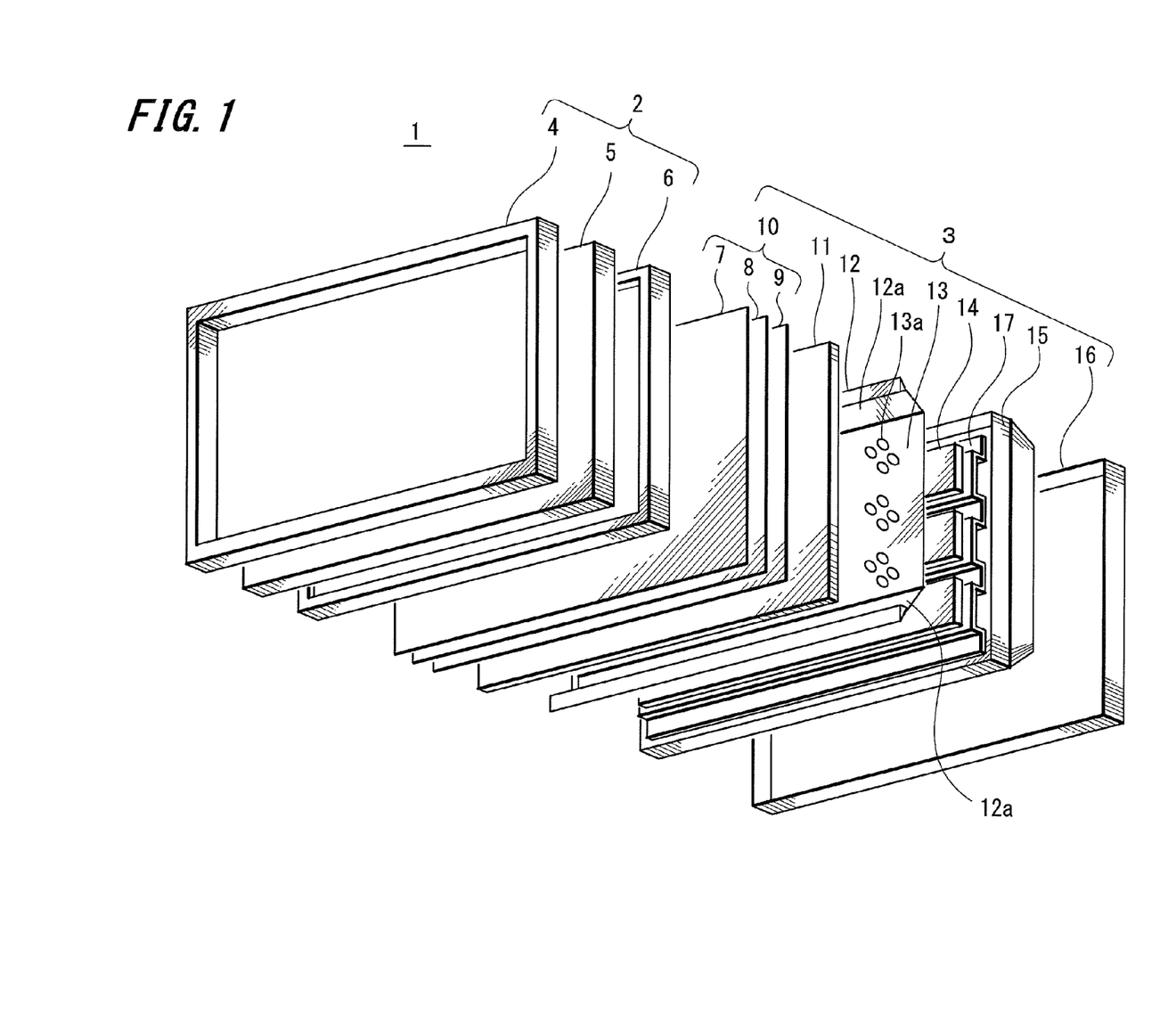
FIG. 1 is an exploded perspective view of a liquid crystal display device according to an embodiment of the present invention.

FIG. 1 is an exploded perspective view of the liquid crystal display device that is an example of the display device according to the embodiment of the present invention.

As shown in FIG. 1, a liquid crystal display device 1 as an example of the display device includes a liquid crystal panel unit 2 and a backlight unit (backlight device) 3 assembled at the rear of the liquid crystal panel 2 to apply display light.

The liquid crystal panel unit 2 includes a front frame 4, a liquid crystal panel 5, and a frame-shaped middle chassis 6 serving as a support mechanism for an optical sheet. In the liquid crystal panel unit 2, an outer periphery of the liquid crystal panel 5 is mounted on the groove formed in a lower side portion of the middle chassis 6. Then, the liquid crystal panel 5 is sandwiched and held in this state between the front frame 4 and the middle chassis 6 through a spacer, a guide member and the like which are not illustrated.

Although a detailed description is here omitted, the liquid crystal panel 5 includes liquid crystal is sealed between a first glass substrate and a second glass substrate facing with a space in between typically maintained with spacer beads or the like. Here, a voltage is applied to the liquid crystal to change the direction of the liquid crystal molecules so that the optical transmittance is changed. The liquid crystal panel 5 includes a stripe-shaped transparent electrode, an insulation film, and an orientation film which are formed on the inside surface of the first glass substrate. Further, color filters for the three primary colors, an overcoat layer, a stripe-shaped transparent electrode, and an orientation film are formed on the inside surface of the second glass substrate. In addition, a polarization film and a phase difference film are bonded to the surfaces of the first glass substrate and second glass substrate.

Further, in the liquid crystal panel 5, the orientation film made of polyimide causes liquid crystal molecules to be arrayed in a horizontal direction on an interface. The polarization film and the phase difference film cause a wavelength characteristic to be achromatic and white, and then a received image or the like is made into a full-color using the color filters to be displayed in color. It should be noted that the structure of the liquid crystal panel 5 is not limited thereto, but may be any of liquid crystal panels having various configurations which have been used.

The backlight unit 3 includes a light-emitting unit, a base member (heat dissipation unit) 17 and a back panel (rear chassis) 16. The light-emitting unit includes a plurality of light source substrates 14 which are arranged at the rear of the liquid crystal panel unit 2 and supply display light. The base member 17 includes the light-emitting unit mounted thereon and dissipates the heat generated in the light-emitting unit. The back panel 16 holds the base member 17 and serves as a support mechanism for the chassis in combination with the middle chassis 6 and a side frame 15. The backlight unit 3 has dimensions corresponding to those of the whole rear surface of the liquid crystal panel unit 2. The backlight unit 3 and the liquid crystal panel unit are combined while a space portion between both the units is optically sealed. Note that, the base member 17 is later explained in detail.

The light source substrate 14 includes an appropriate number of red LEDs, green LEDs, blue LEDs (hereinafter, referred to as LEDs) and other components mounted and arrayed in a predetermined order on a laterally rectangular wiring substrate. LEDs 30 of three primary colors form a light-emitting block, and a basic unit of the light emitting block includes one red LED, one or two green LED(s), and one blue LED, for example. It should be noted that three rows of the light source substrates are illustrated in the example shown in FIG. 1, but the number of light source substrates is not limited to this example.

An approximately box-shaped reflection sheet 12 having a bottom plane portion 13 is provided in front of the light source substrate 14. The bottom plane portion 13 of the reflection sheet 12 includes holes 13a bored at the position corresponding to respective LED mounted on the surface of the light source substrate 14 so that the LEDs of respective colors are inserted into the corresponding holes 13a. Accordingly, the respective LEDs are provided to be enclosed in a space (light guide space) formed between a diffusion plate 11 and the reflection sheet 12. Light rays emitted toward the bottom plane portion 13 of the reflection sheet 12 among the light rays radiated from the respective LED to the surroundings are reflected on the surface of the bottom plane portion 13 and emitted toward the liquid crystal panel 5.

The reflection sheet 12 includes inclined portions 12a, 12a, having a predetermined angle to the bottom plane portion 13, formed between upper and lower lateral side portions of the reflection sheet 12 and the bottom plane portion 13, respectively. For example, an angle having the most favorable luminance distribution on a light-irradiated surface is selected between 0° and 90° as the predetermined angle. The reflection sheet 12 is molded using a foamable PET (Polyethylene Terephthalate) material containing a fluorescent agent, for example. The foamable PET material has a characteristic of high reflectivity about 95% and has such a feature that a color tone is different from the metal luster color to make scratches on a reflection surface less noticeable. It should be noted that the reflection sheet 12 may be formed of a material such as silver, aluminum, or stainless steel having a mirror finished surface.

The diffusion plate 11 for diffusing light emitted from LEDs and an optical sheet group 10 including optical sheets 7, 8 and 9 are provided at the front of the reflection sheet 12. The diffusion plate 11 is arranged on the surface of the optical sheet group 10 opposite the liquid crystal panel 5 and stacked with lower ends thereof being aligned. The diffusion plate 11 is made of a transparent synthetic resin material having light guiding property such as a slightly thick plate molded from acrylic resin and polycarbonate resin, for example.

The optical sheet group 10 includes a plurality of stacked optical sheets having various optical functions. For example, an optical sheet may have the function of resolving display light supplied from the LED mounted on the light source substrate 14 and incident on the liquid crystal panel 5 into a polarization component perpendicular to the incident light. Another optical sheet may have the function of compensating a phase difference of light wave to prevent a wider view angle and being chromatic. Further another optical sheet may have the function of diffusing display light. As shown in FIG. 1, the optical sheet group 10 includes, for example, the optical sheet 9 as a diffusion sheet, the optical sheet 8 as a prism sheet, and the optical sheet 7 as a polarized light conversion sheet, incident planes of which have the same shape and size. It should be noted that the configuration of the optical sheet group 10 is not limited to the one described above. The optical sheet group 10 may include an optical film for improving luminance, upper and lower diffusion sheets sandwiching a phase difference film and a prism sheet, for example.

The backlight unit 3 has the above-described configuration in which display light supplied from each LED mounted on the plurality of light source substrates 14 is incident on the diffusion plate 11 from the rear. The diffusion plate 11 diffuses the display light incident from one main surface thereof by refracting and reflecting light within the plate so that the light is guided to be incident on the optical sheet group 10 from the other main surface. Further, in the case where part of the display light emitted from each LED is incident on the diffusion plate 11 at an angle exceeding a critical angle, such display light is reflected on the surface of the diffusion plate 11. The light reflected on the surface of the diffusion plate 11 and part of the display light radiated from each LED to the periphery and reflected by the reflection sheet 12 are repetitively reflected between those diffusion plate 11 and reflection sheet 12, thereby improving the reflectance based on the principle of multiple reflection.

Subsequently, the backlight unit 3 is combined with the liquid crystal panel 5, four sides of which are covered with the front frame 4 to fix the whole device including the liquid crystal panel 5 so that the liquid crystal display device 1 is completed. Thus, the liquid crystal display device 1 is assembled such that respective components are stuck together and overlapped. Here, the front frame 4, middle chassis 6, side frame 15 and back panel 16 are formed of metal, resin or the like.

Figure 2:
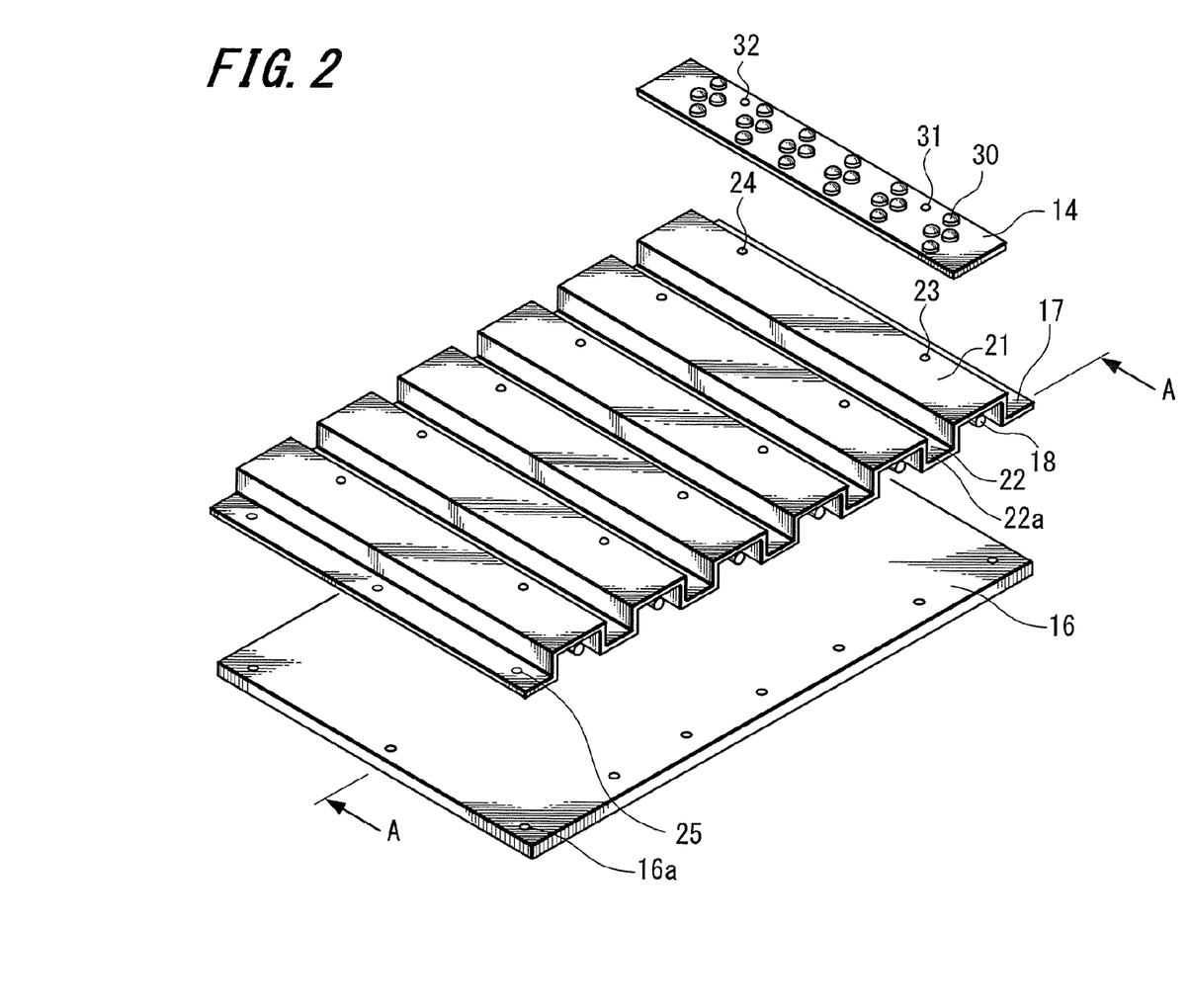
FIG. 2 is a perspective view provided for explaining a base member according to an embodiment of the present invention.
Figure 3:
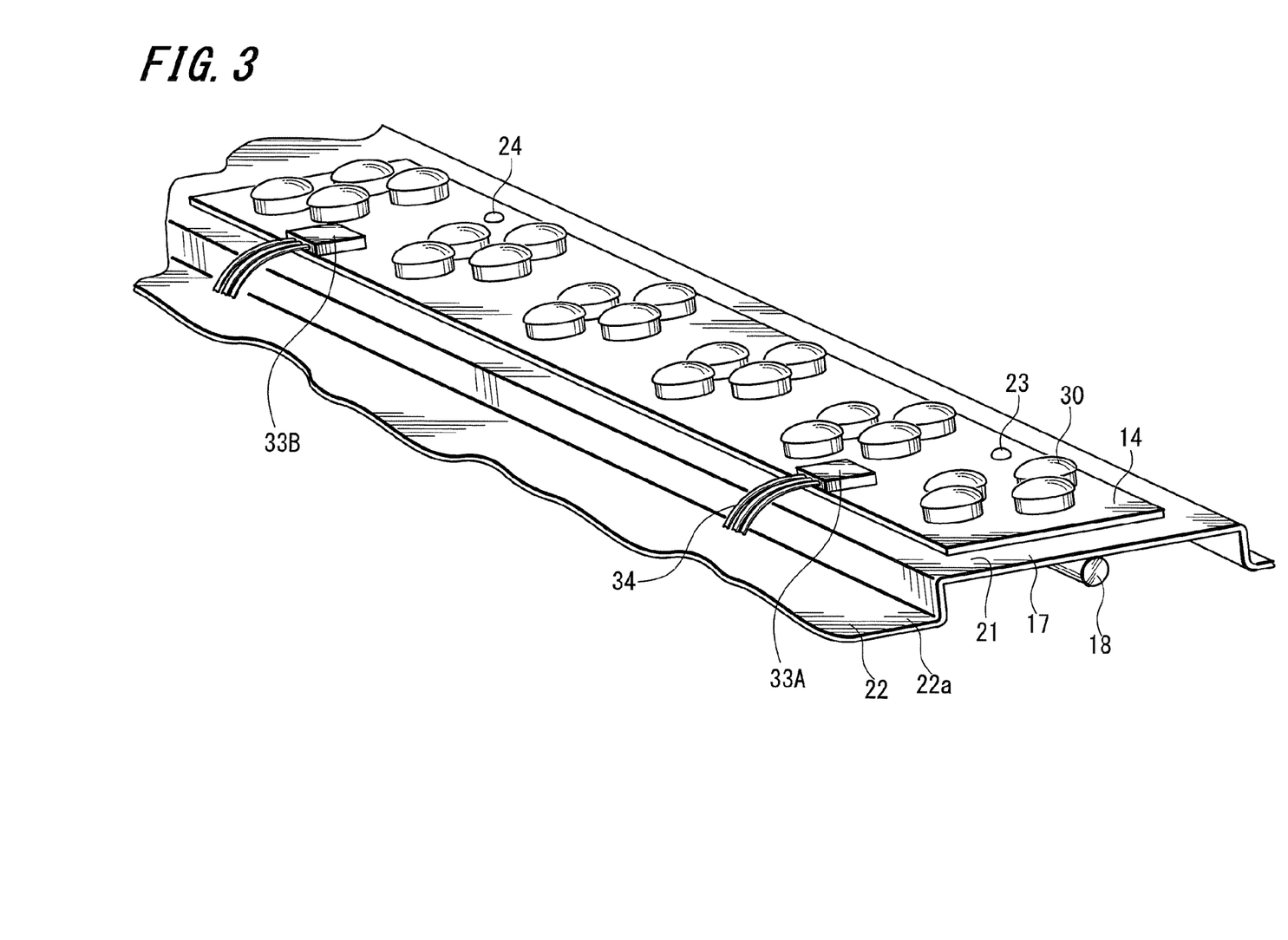
FIG. 3 is a perspective view of a light source substrate mounted on a base member according to an embodiment of the present invention.
Figure 4:
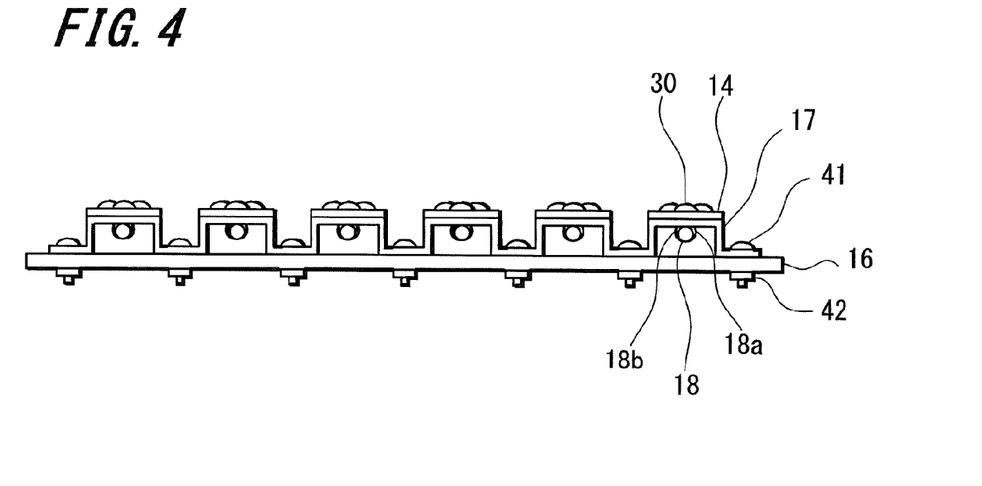
FIG. 4 is a cross-sectional view of a base member along an A-A line according to an embodiment of the present invention.

Next, the base member, on which the light source substrate 14 is mounted, is explained in detail with reference to FIGS. 2 through 4. FIG. 2 is a perspective view provided for explaining the base member 17; FIG. 3 is a perspective view of the light source substrate 14 mounted on the base member 17; and FIG. 4 is a cross-sectional view of the base member 17 along an A-A line shown in FIG. 2. It should be noted that the reflection sheet 12 (shown in FIG. 1) is not illustrated in FIGS. 2 through 4 for the convenience of explanation. In addition, one wiring substrate 14 alone is illustrated in FIG. 2 and the other wiring substrates 14 are omitted, although the base member 17 shown in FIG. 2 has a structure capable of mounting six wiring substrates 14.

The base member 17 shown in FIG. 2 includes the light source substrate 14 mounted thereon and holds the heat pipe 18. The base member 17 has a plurality of groove portions 22 extending in a lateral direction of the liquid crystal panel 5 formed at predetermined intervals and a plurality of flat mounting planes 21 to mount the light source substrate 14 facing the rear of the liquid crystal panel 5 respectively formed between those groove portions 22. The light source substrate 14 is arranged in a lateral direction on the mounting plane 21, and a width (a size in a vertical direction) of one mounting plane 21 is equal to the width of the light source substrate 14 or slightly larger than that. The base member 17 shown in FIG. 2 has six mounting planes 21 for mounting the light source substrate 14.

It should be noted that a length of the base member 17 shown in FIG. 2 in a right and left direction for the display screen is short for the convenience of explanation. However, the base member 17 is actually formed to have the length capable of illuminating the whole surface of the liquid crystal panel 5 with light. For example, in the case of a liquid crystal display device having the display screen of about 70 inches, one row of light source block includes four light source substrates 14 shown in FIG. 2 arranged in parallel, and one base member 17 may include six rows of the light source blocks. Further, the base member of the 70-inch liquid crystal display device includes two base members 17 connected in upper and lower direction respectively having six rows each having four light source substrates 14. The above-described base member 17 is produced by extrusion processing on aluminum (Al) sheet metal, for example.

Since the mounting plane 21 between the groove portions 22 is positioned higher than a bottom portion 22a of the groove portion 22, the level difference is used to form a space in which the heat pipe 18 is held in the lengthwise direction of the light source substrate 14 on the lower side of the mounting plane 21. As shown in FIG. 4, elastic holding portions 18a and 18b are provided on the rear surface of the mounting plane 21 so that an outer circumference portion of the heat pipe 18 is held by those holding portions 18a and 18b in two directions. According to the configuration as described above, the heat pipe 18 can be attached and removed easily. It should be noted that the configuration for holding the heat pipe 18 is not limited to the above-described example. The heat pipe 18 may be fit into a reverse-Ω shaped fixing member and the fixing member is fixed by screwing to the rear surface of the mounting plane 21, for example.

The mounting plane 21 of the base member 17 has a predetermined number of, two for example, projections 23 and 24 provided in the lengthwise direction for accurately positioning the light source substrate 14, and positioning holes 31 and 32 fitting to the respective projections 23 and 24 are bored at predetermined positions in the light source substrate 14 correspondingly to the projections 23 and 24 of the mounting plane 21. The positioning holes 31 and 32 have approximately the same diameter or approximately the same cross-sectional shape as the respective projections 23 and 24 to facilitate less shaking and precise positioning. As shown in FIG. 3, the light source substrate 14 is mounted on the mounting plane 21 so that the projections 23 and 24 of the mounting plane 21 are inserted into the positioning holes 31 and 32 of the light source substrate 14. Then, the light source substrate 14 is fixed to the accurate position on the mounting plane 21 using an adhesive heat conduction sheet pasted on the rear surface of the light source substrate 14. Heights of the projections 23 and 24 are set so as not to stick out of the mounting plane 21 when those projections are respectively inserted into the positioning holes 31 and 32. In addition, the projections 23 and 24 may have various shapes such as semicircle shape and cylindrical shape.

All the light source substrates 14 are formed based on the same specification, in which a signal output connector 33A and a signal input connector 33B are mounted at positions in the vicinity of one lateral portion in the width direction and toward the both ends in the lengthwise direction on the main plane of the light source substrate 14. Each LED 30 of the light source substrate 14 is connected to a LED control unit (not illustrated) through the connectors 33A and 33B and a signal input/output lead wire 34 so that light emission is controlled.

A predetermined number of mounting holes 25 are formed along the groove in the bottom plane 22a of respective groove portions 22 in the base member 17. In addition, mounting holes 16a are formed in the back panel 16 at positions corresponding to the above-described mounting holes 25 in the base member 17. Then, as shown in FIG. 4, a male screw 41 is inserted into the mounting hole 25 of the base member 17 and the mounting hole 16a of the back panel 16 and screwed into a nut 42 so that the base member 17 is fixed to the back panel 16.

The back panel 16 is formed into a rectangular-plate shape having a size substantially the same as an outer shape of the liquid crystal panel 5 using a comparatively lightweight aluminum material having mechanical rigidity, for example. The back panel 16 also has heat conductivity so that the heat generated from a light guide space portion, a circuit component and the like can be dissipated. Although not described in detail, a periphery wall portion (not illustrated) combined with the middle chassis 6 and the side frame 15 is formed at an outer periphery region as described above. In addition, a number of mounting portions to attach an optical stud material (not illustrated), mounting holes to fix the base member 17 and pull-out openings to pull out the lead wire, and the like are formed in the back panel 16.

The heat pipe 18 provided right under the light source substrate 14 is a member typically used to conduct heat from a high temperature portion such as a power supply portion to a heat dissipation mechanism in various electronic devices and the like. The heat pipe 18 includes a conductive medium such as water, which evaporates at a predetermined temperature, sealed in an air-exhausted metal pipe material such as copper that is excellent in heat conductivity to have highly efficient heat conductivity. Both end portions of the heat pipe 18 are connected directly or indirectly to heat sinks 50A and 50B, which are later described. In the heat pipe 18, the conductive medium sealed in the inside thereof evaporates from liquid to gas upon receiving the heat conducted from the light source substrate 14 having a high temperature. In the heat pipe 18, the evaporated conductive medium is cooled by flowing in the pipe to portions connecting with the heat sinks 50A and 50B having a low temperature to discharge condensation heat so that the evaporated conductive medium becomes liquid. In the heat pipe 18, the liquefied conductive medium circulates in the pipe by moving toward the mounting plane 21 through a capillary phenomenon in a porous layer and a number of lengthwise grooves formed in an inner wall of the metal pipe, and therefore the heat pipe 18 has a highly efficient heat conductive action.

According to the embodiment, the heat pipe 18 is integrally attached to the base member 17 using the holding portions 18a and 18b and extended closely right under the region where respective LEDs 30 are arrayed as a source of heat generation. The light source substrate 14 with the LEDs 30, the base member 17 having the light source substrate 14 arranged thereon, and the heat pipe 18 are overlapped in a close contact state to form a heat conductive path to the heat sinks 50A and 50B. The heat generated from each LED on the light source substrate 14 is transmitted to the heat pipe 18 mounted right under the light source substrate 14 through the mounting plane 21 of the base member 17. According to such configuration, the space can be efficiently used and the heat generated from each LED 30 is conducted efficiently to the heat sinks 50A and 50B for heat dissipation. Accordingly, the light guide space portion is prevented from having a high temperature so that the backlight unit 3 operates stably to supply display light to the liquid crystal panel 5.

Figure 5:
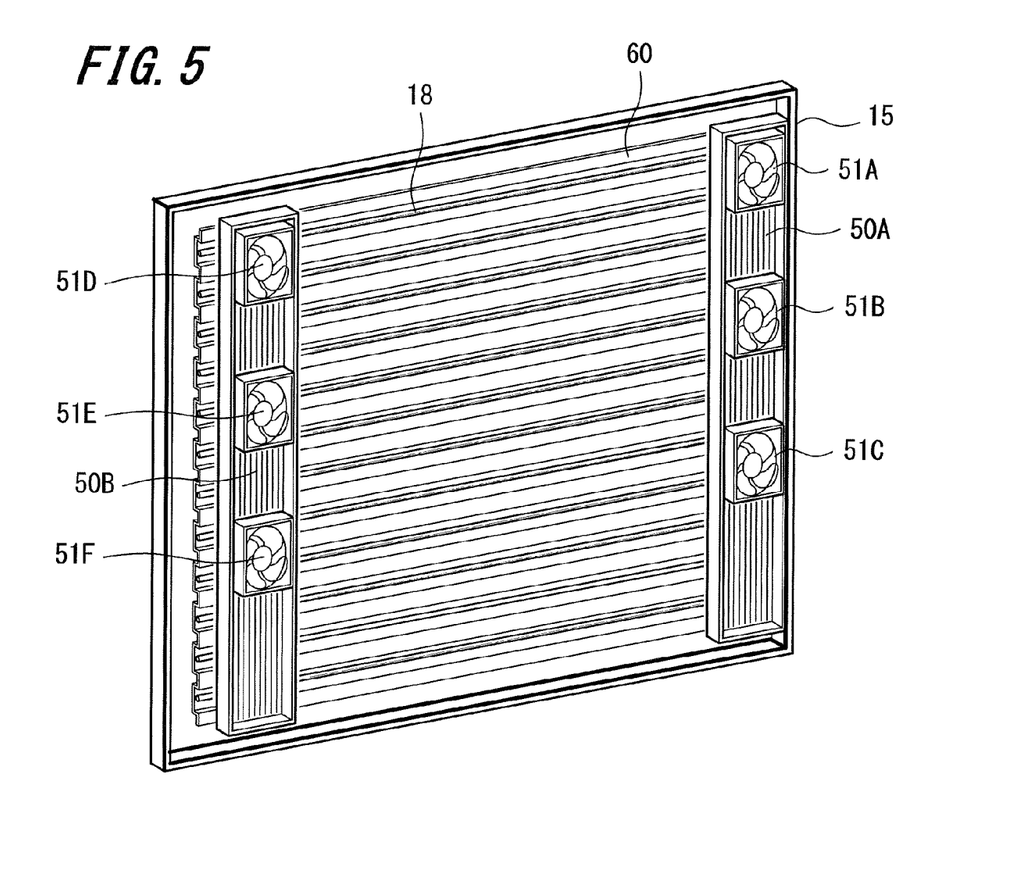
FIG. 5 is a perspective view of the whole rear surface of a backlight unit according to an embodiment of the present invention.

FIG. 5 is a perspective view showing a rear surface of the whole backlight unit and an illustration of the back panel 16, to which a base member 60 is fixed, is here omitted. The backlight unit shown in FIG. 5 is a backlight unit used for a large-size liquid crystal display device, which is the liquid crystal display device of 70 inches or larger, for example. The base member 60 includes two base members 17 each having the six-stage structure (refer to FIG. 2) in which six mounting planes 21 are formed. Twelve heat pipes 18, that is, double the number of heat pipes for the base member 17 are provided.

As shown in FIG. 5, a pair of heat sinks 50A and 50B are attached respectively in the vicinity of lengthwise both ends of the mounting plane 21 of the base member 17, more specifically at right and left end positions of the back panel 16. Such heat sinks 50A and 50B are also used independently or in combination with the heat pipe 18 as heat dissipation members of the power supply portion and the like in various electronic devices, for example. The heat sinks 50A and 50B are members having a large surface area by integrally forming a large number of fins using a material such as an aluminum material that is excellent in heat conductivity. The heat sinks 50A and 50B cool down a high temperature portion by dissipating the heat from a surface of each fin upon receiving the heat conducted from the high temperature portion.

In addition, a pair of cooling fans are combined with each of the heat sinks 50A and 50B to improve the heat dissipation efficiency. According to the embodiment, the cooling fans 51A, 51B and 51C are attached to the heat sink 50A, and the cooling fans 51D, 51E and 51F are attached to the heat sink 50B. Each of the heat sinks 50A and 50B uses each cooling fan to blow air between the fins so that the heat dissipation from the surface of each fin is facilitated. The cooling fans 51A through 51F are typically used as a cooling and heat dissipation device of a high temperature region being attached to a chassis and the like in various electronic devices, for example. Here, except the portion where each of the cooling fans 51A through 51F is mounted, the respective heat sinks 50A and 50B are covered with a back cover of the chassis or the like to secure a flow path of cooling air.

Figure 6:
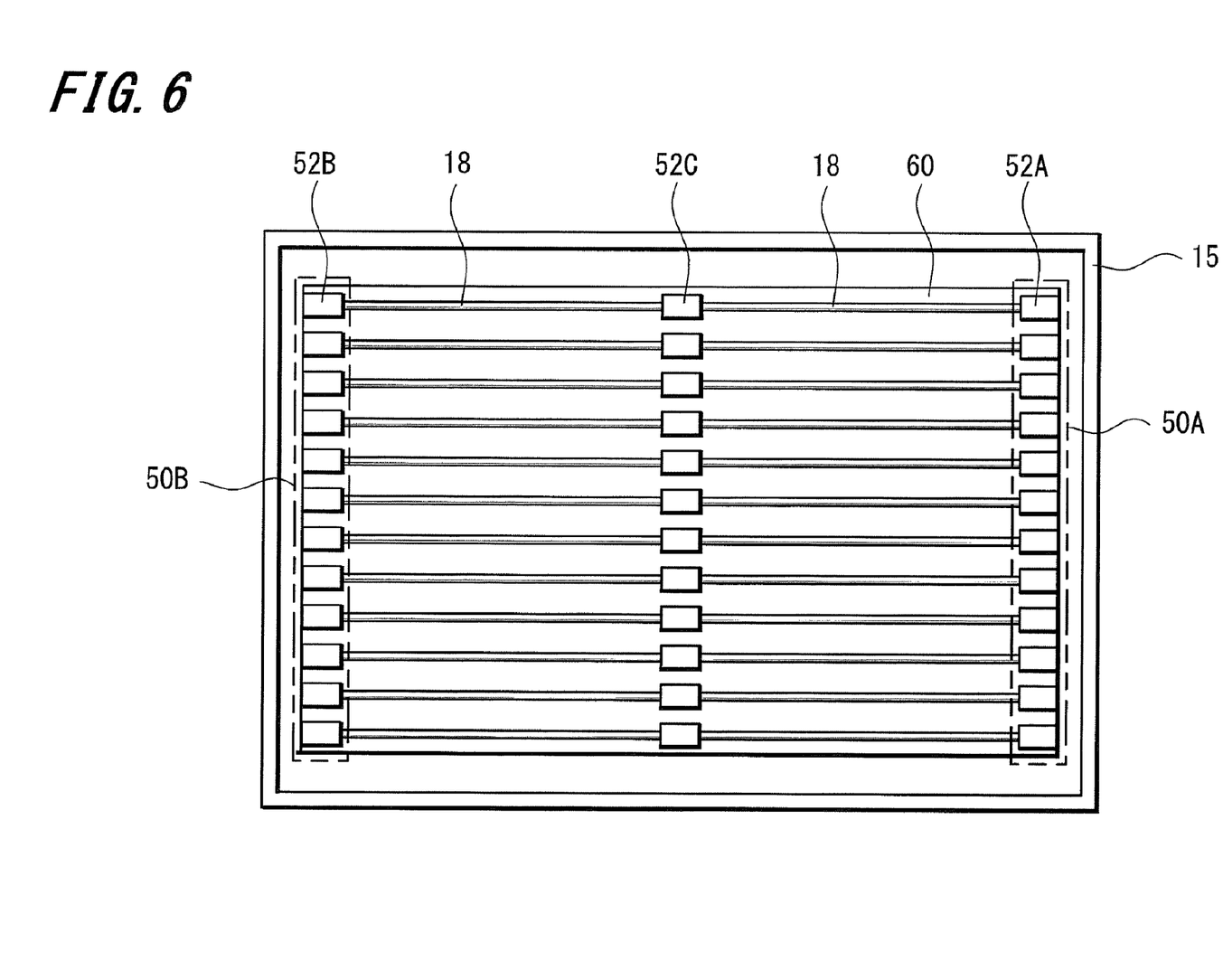
FIG. 6 is a rear view of a base member according to an embodiment of the present invention.

FIG. 6 is a schematic rear view of the base member 17. As shown in FIG. 6, approximately rectangular heat dissipation blocks (heat dissipation members) 52A and 52B are attached to the both ends of the heat pipe 18 mounted on the rear surface of the base member 17. As understood from FIG. 6, the heat dissipation blocks 52A and 52B are short in the right and left direction without corresponding to the length of the heat pipe 18. In addition, each of the blocks has the size that can be accommodated in a space on the lower side of the mounting plane 21 of the base member 17 in upper and lower direction. The heat dissipation blocks 52A and 52B are attached to the positions corresponding to the heat sinks 50A and 50B, and through the heat sinks 50A and 50B, efficiently dissipate the heat transmitted from the light source substrate 14 to the heat pipe 18. The heat dissipation blocks 52A and 52B are attached so that parts thereof, which are bottom planes for example, are fixed in contact with the back panel 16.

A heat dissipation block 52C is attached to a middle part of the heat pipe 18 in the center of the base member 17. This heat dissipation block 52C is provided to connect the heat dissipation block 52A and the heat dissipation block 52B serving as one heat conductive path, since the length of the heat pipe 18 becomes insufficient as the display screen of the liquid crystal display device becomes large. Therefore, if it is possible to prepare the heat pipe 18 having a sufficient length and satisfy other conditions, the heat dissipation block 52C may not be necessarily required.

The heat dissipation blocks 52A, 52B and 52C are made of an aluminum material, which is excellent in heat conductivity, excellent to be processed, light-weighted and less expensive. Those blocks are formed to have a rectangular plate shape having a width to be accommodated in the space where the above-described heat pipe 18 is mounted and a predetermined length in the lengthwise direction of the heat pipe 18 by the extrusion processing and the like. Further, each of the heat dissipation blocks 52A, 52B and 52C is arranged at the lower side of the mounting plane 21, which contributes to an improvement in mechanical rigidity of a convex portion having the mounting plane 21 as an upper surface. It should be noted that a material for the heat dissipation blocks 52A, 52B and 52C is not limited to the aluminum material but may be formed of an aluminum alloy material, a magnesium alloy material, or a material such as a silver composite material and a copper material, for example, which are excellent in heat conductivity.

Here, a method of fixing the heat dissipation block 52A (52B) is explained with reference to FIG. 7.

Figure 7:
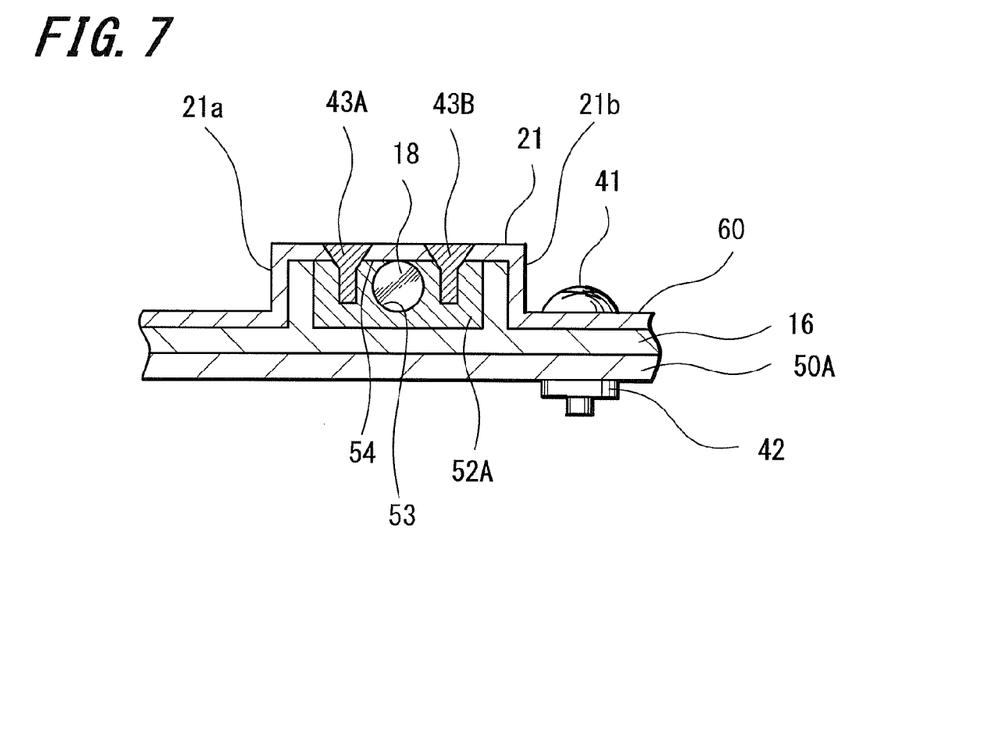
FIG. 7 is an explanatory diagram showing an example of a method of fixing a block according to an embodiment of the present invention.

FIG. 7 shows a cross-sectional view of a state in which the base member 60 is fixed to the back panel 16 and the heat sink 50A. As shown in FIG. 7, first, mounting holes are provided at two places, for example, in the mounting plane 21 of the base member 60, and female screws are formed in the heat dissipation block 52A at positions corresponding to the above-described mounting holes of the mounting plane 21. Then, the heat dissipation block 52A having the heat pipe 18 attached thereto is arranged at the lower side of the mounting plane 21 of the base member 60 and fixed in this state by screwing into the base member 60 using flat head male screws 43A and 43B. Subsequently, the base member 60, the back panel 16 and the heat sink 50A are fixed at the bottom portion of the base member 60 using a male screw 41 and a nut 42.

As shown in the cross-section of the heat dissipation block 52A, the block is made to have an approximately rectangular cross-section that can be accommodated in a space formed by the mounting plane 21, lateral walls 21a and 21b of the base member 60 and the back panel 16. In addition, the block is formed to have a height that the lower surface of the heat dissipation block 52A is brought in contact with the back panel 16 when the base member 60, the back panel 16 and the heat sink 50A are fixed using the male screw 41 and the nut 42. The larger the contact area is, the greater the heat dissipation effect becomes.

The heat dissipation block 52A is attached using a heat pipe fitting hole 53 having an opening on one plane or penetrating from one plane to the opposite plane, for example, so that the heat pipe 18 is inserted thereto and assembled. A method of mounting the heat pipe 18 is not limited thereto. A reverse-$\Omega$ shaped heat pipe fitting concave portion may be formed to have an opening in the upper plane 54 of the heat dissipation block 52A facing the rear surface of the mounting plane 21 of the base member 17. Subsequently, the heat pipe 18 may be fit into the heat pipe fitting concave portion downward from the upper plane 54, for example.

Since the method of fixing the heat dissipation block 52B to the base member 60 is similar to the above, the explanation thereof is omitted. Note that the heat dissipation block 52C is fixed so as not to be in contact with the back panel 16. This is because the heat dissipation block 52C is positioned having a distance from the heat sinks 50A and 50B and therefore the heat uniformity and the heat dissipation may be obstructed if the heat dissipation block 52C is in contact with the back panel 16. With the structure of the heat dissipation block 52C not in contact with the back panel 16, since the heat generated in the central part of the display screen of the liquid crystal display device is transmitted through the heat pipe 18 and dissipated from the heat dissipation blocks 52A and 52B positioned at the both ends, the heat uniformity and the heat dissipation effect may be improved.

Next, another example of the method of fixing the heat dissipation block 52A (52B) is explained with reference to FIG. 8.

Figure 8:
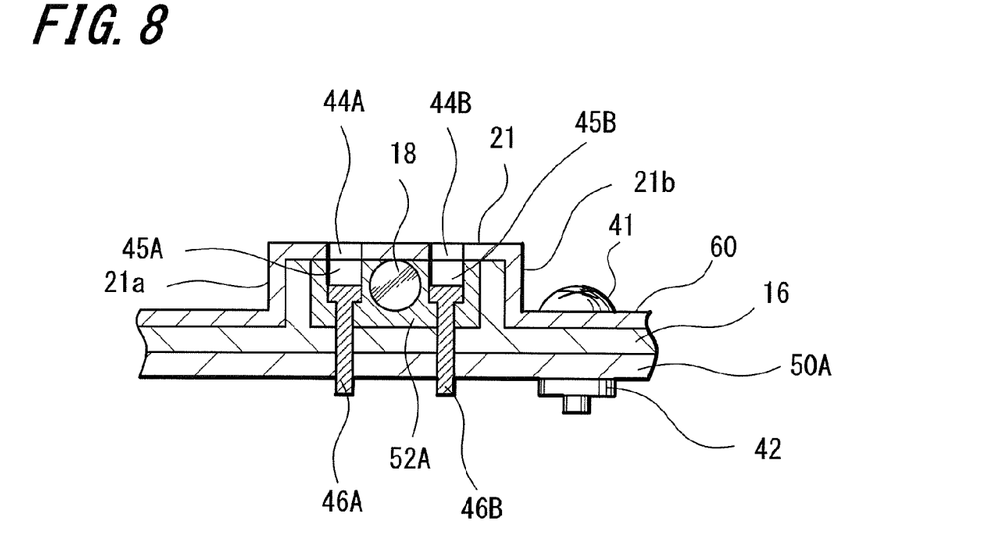
FIG. 8 is an explanatory diagram showing another example of a method of fixing a block according to an embodiment of the present invention.

FIG. 8 shows a cross-sectional view of a state in which the base member 60 is fixed to the back panel 16 and the heat sink 50A. As shown in FIG. 8, first, mounting holes 44A and 44B are provided in the mounting plane 21 of the base member 60, for example. In the heat dissipation block 52A are bored holes 45A and 45B having the depth to the extent that head portions of later-described male screws 46A and 46B are submerged therein at positions corresponding to the respective mounting holes of the mounting plane 21. Subsequently, female screws are respectively formed to penetrate from the bottom of those holes 45A and 45B toward the lower side. Further, the same female screws are formed to the back panel 16 and the heat sink 50A at positions corresponding to the female screws provided in the heat dissipation block 52A.

Subsequently, the heat dissipation block 52A having the heat pipe 18 attached thereto is arranged on the lower side of the mounting plane 21 of the base member 60 and is fixed in this state by inserting male screws 46A and 46B into the mounting holes 44A and 44B of the base member 60 such that the heat dissipation block 52A is screwed as being skewered with the back panel 16 and the heat sink 50A. Subsequently, the base member 60, the back panel 16 and the heat sink 50A are fixed at the bottom portion of the base member 60 using the male screw 41 and the nut 42. If both the back panel 16 and the heat sink 50A have plate thicknesses difficult to cut the female screws, the heat dissipation block 52A may be fixed using the nut.

As shown in FIG. 8, a method of mounting the heat pipe 18 on the heat dissipation block 52A may employ the method described with reference to FIG. 7, and therefore the explanation thereof is omitted here. Further, the method of fixing the heat dissipation block described with reference to FIG. 8 can also be applied to the method of fixing the heat dissipation block 52B to the base member 60, and therefore the explanation thereof is omitted.

Moreover, a method of fixing the heat dissipation block is not limited to the above-described method but other methods may also be adopted. For example, the upper and lower sides of the heat dissipation block 52A (52B) are sandwiched (or pressed) between the base member 60 and the back panel 16 so that the heat dissipation block 52A (52B) is held in a state of being in close contact with the base member 60 and the back panel 16. As a result, the male screws 43A and 43B shown in FIG. 7 and the male screws 46A and 46B shown in FIG. 8 may be unnecessary. In that case, predetermined engaging mechanisms or slip prevention processing may be applied between the heat pipe 18 and the heat dissipation block 52A (52B) so as to prevent the heat dissipation block 52A (52B) from sliding in the lengthwise direction of the heat pipe 18. Hence, it is possible to reduce the number of fixing parts such as the male screws and assembly processes.

According to the above-described embodiments, the base member 17 (60) is made of a sheet metal instead of a bulk material such as a heat dissipation plate used in the past, and therefore the weight is reduced. Further, a processed object is the sheet metal and relatively simple processing such as extrusion processing can be adopted, for example, and therefore it is possible to simplify the material processing and manufacturing.

Further, the heat pipe 18 carries the heat generated in the central part of the backlight unit to the right and left side on the display screen where the heat sinks 50A and 50B are arranged, and therefore the heat can be carried efficiently so that the heat uniformity and heat dissipation can be obtained. The heat can be transmitted to the heat pipe 18 through the base member 17 (60). Moreover, in the case where the heat dissipation blocks 52A and 52B are provided, the heat generated in the light source substrate 14 and transmitted to the heat pipe 18 through the base member 17 (60) can be directly dissipated from the heat dissipation blocks 52A and 52B to the heat sinks 50A and 50B so that the heat dissipation capability can be improved.

Accordingly, in the embodiments described above, it is possible to suppress the cost increase associated with the increase in size of the liquid crystal display device from both the viewpoints of material aspect and process aspect while maintaining the heat uniformity and heat dissipation performance. It should be noted that those embodiments are not limited to a large-size liquid crystal display but can also be applied to a small-size display device. The cost reduction is effective particularly in the case of a large-size liquid crystal display device.

Here, since the embodiments described above are specific examples suitable for the present invention, there are technically various limitations, but the scope of the present invention is not limited to those embodiments unless it is specifically described that the present invention is limited to those described in the above explanation. For example, the materials used, amounts thereof, and numerical conditions such as processing time and dimensions stated in the above description represent preferred embodiments, and the size, shape, and arrangement in respective drawings used for the explanation also represent an outline thereof.

Further, the base member having the light source substrate mounted thereon is made of the sheet metal with the repeated convex and concave shapes (i.e., the sheet metal is corrugated) according to the embodiments of the present invention (e.g., FIGS. 2 and 4), and therefore the embodiment of the present invention can also be applied to other display devices such as an LED display device without using a transmissive display panel in addition to the liquid crystal display device using the transmissive liquid crystal panel shown in the above-described embodiments.

Furthermore, it should be appreciated that various alterations and modifications may be effected without deviating from the scope and spirit of the present invention such that CCFL and electric light bulb are used instead of the LED as the light source of the above-described display device, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A backlight unit configured for illuminating a rear of a transmissive display panel with light, comprising:
   a chassis;
   a plurality of light source substrates, each having a light source configured to face the rear of the display panel;
   a base member made of sheet metal on one side of which the light source substrates are mounted and which is fixed to a rear of the chassis; and
   a plurality of heat pipes attached to an opposite side of the base member and configured to receive via the base member heat generated by the light sources,
   wherein,
      the heat pipes are located in registry with the light sources,
      the base member has a lengthwise direction and is corrugated to have (a) a plurality of groove portions extending in the lengthwise direction and (b) a plurality of alternating upper and lower planes,
      the light source substrates extend in the lengthwise direction and are mounted on top of respective upper planes of the base member, and
      the heat pipes extend in the lengthwise direction of the light source substrates under the respective upper planes.

2. The backlight unit according to claim 1, further comprising
   a heat dissipation member having a heat pipe fitting portion under each of the upper planes at positions in the vicinity of both lengthwise ends of each of the upper planes of the base member,
   wherein,
      the heat dissipation member is provided under each of the upper planes of the base member in a state of the vicinity of both ends of the heat pipe being fit into the heat pipe fitting portions.

3. The backlight unit according to claim 2, wherein part of the heat dissipation member is fixed in contact with the rear of the chassis.

4. The backlight unit according to claim 3, wherein the heat dissipation member is rectangular in cross section and a plane of the heat dissipation member is in surface contact with the rear of the chassis.

5. The backlight unit according to claim 1, wherein:
two or more projections extend from the upper planes of the base member and positioning holes for the projections are in the light source substrate at positions corresponding to the projections, and
the light source substrates are secured on the upper planes of the base member with each projection of the base member inserted into its corresponding positioning hole in the light source substrates.

6. The backlight unit according to claim 1, wherein the base member is made of aluminum sheet metal and not a bulk material.

7. The backlight unit of claim 1, further comprising a heat conductive medium that evaporates at a predetermined temperature in the heat pipes.

8. The backlight unit of claim 7, wherein the heat pipes are sealed to contain the heat conductive medium therein.

9. The backlight unit of claim 1, further comprising:
a back panel unit secured to the base member along the lower planes.

10. The backlight unit of claim 1, wherein grooves face the display panel.

11. A display device comprising:
a chassis;
a plurality of light source substrates, each having a light source configured to face the rear of the display panel;
a base member made of sheet metal on one side of which the light source substrates are mounted and which is fixed to a rear of the chassis;
a plurality of heat pipes attached to an opposite side of the base member and configured to receive via the base member heat generated by the light sources, and
a display screen positioned so as to be backlit by the light sources,
wherein,
the heat pipes are located in registry with the light sources,
the base member has a lengthwise direction and is corrugated to have (a) a plurality of groove portions extending in the lengthwise direction and (b) a plurality of alternating upper and lower planes,
the light source substrates extend in the lengthwise direction and are mounted on top of respective upper planes of the base member, and
the heat pipes extend in the lengthwise direction of the light source substrates under the respective upper planes.

12. The backlight unit of claim 11, further comprising a heat conductive medium that evaporates at a predetermined temperature in the heat pipes.

13. The backlight unit of claim 12, wherein the heat pipes are sealed to contain the heat conductive medium therein.

* * * * *